United States Patent [19]
Payne

[11] Patent Number: 4,462,188
[45] Date of Patent: Jul. 31, 1984

[54] SILICA SOL COMPOSITIONS FOR POLISHING SILICON WAFERS

[75] Inventor: Charles C. Payne, Aurora, Ill.

[73] Assignee: Nalco Chemical Company, Oak Brook, Ill.

[21] Appl. No.: 390,726

[22] Filed: Jun. 21, 1982

[51] Int. Cl.³ .............................................. B24B 1/00
[52] U.S. Cl. .................................. 51/283 R; 51/308; 106/3; 252/544; 252/547; 252/155
[58] Field of Search ................. 51/283 R, 281 R, 323, 51/308, 293; 106/3; 252/155, 148, 544, 547

[56] References Cited

U.S. PATENT DOCUMENTS

| | | | |
|---|---|---|---|
| 2,060,850 | 11/1936 | Calcott | 252/155 |
| 3,146,208 | 8/1964 | Fisher et al. | 252/148 |
| 3,170,273 | 2/1965 | Walsh et al. | 51/281 R |
| 3,715,842 | 2/1973 | Tredinnick et al. | 51/308 X |
| 3,807,979 | 4/1974 | Cromwell | 51/308 |
| 3,925,229 | 12/1975 | Bolsing | 252/146 |
| 4,129,457 | 12/1978 | Basi | 51/323 |
| 4,169,337 | 10/1979 | Payne | 51/283 R |

Primary Examiner—Frederick R. Schmidt
Assistant Examiner—Robert A. Rose
Attorney, Agent, or Firm—John G. Premo; Robert A. Miller; Donald G. Epple

[57] ABSTRACT

Semi-conductors can be polished with greater efficiency using as a polishing agent a blend of colloidal silica or silica gel, a water-soluble amine and a water-soluble quaternary ammonium salt or base.

1 Claim, No Drawings

SILICA SOL COMPOSITIONS FOR POLISHING SILICON WAFERS

INTRODUCTION

U.S. Pat. No. 3,170,273, the disclosure of which is incorporated herein by reference, shows that colloidal silica and silica gels are useful as polishing agents for the surfaces of semi-conductor crystals which are most often used in th manufacture of semi-conductor devices. The siliceous polishing agents of this patent are particularly suited to producing highly polished surfaces on silicon crystal wafers, thus rendering these surfaces suitable for the disposition of an epitaxially deposited crystal layer.

The silica sols and silica gels used by the patentee have an ultimate particle size of 4-200 millimicrons. From a commercial standpoint, it is preferred to use as the polishing agents in the process of the patent aqueous colloidal silica sols having particle sizes within the range of 4-100 millimicrons.

A substantial improvement in polishing efficiency over U.S. Pat. No. 3,170,273 is disclosed in U.S. Pat. No. 4,169,337. The disclosure, is incorporated herein by reference. In accordance with that invention, it was found that semi-conductor surfaces of the type previously described and, most particularly, silicon, can be efficiently polished by using as the polishing agent a combination of either a colloidal silica sol or silica gel having an ultimate particle size within the range of 4-200 millimicrons and, preferably, 4-100 millimicrons, with a water-soluble amine. The amount of amine in relation to the silica present in the silica sol or gel may range between 0.5-5.0% based on th $SiO_2$ content of the sol or gel. The preferred amount of the amine is 1.0-5.0% and, most preferably, it is 2.0-4.0%.

The amines should contain between 2-8 carbon atoms and are preferably aliphatic in character. Diamines containing 2-8 carbon atoms and, preferably, aliphatic in character will also give excellent polishing results. Most preferably, the amines containing one primary amino group or containing serveral amino groups should be used. Preferred amines contain at least one hydroxy alkyl group and one primary amino group.

THE INVENTION

In accordance with the present invention, it has been found that polishing agents used in the practice of U.S. Pat. No. 4,169,337 can be improved substantially if there is added to such compositions between 1.0-5.0% and, most preferably, between 2.0 and 4.0% by weight of a water-soluble quaternary ammonium salt or base.

In a preferred embodiment of the invention, the water soluble quaternary ammonium salts or hydroxides and should not contain more than 6 carbon atoms. In a preferred embodiment, they contain one or more alkyl groups that should not exceed 2 carbon atoms in chain length. The compounds may, of course, contain 1 or more aromatic groupings, as long as water-solubility is maintained. They may contain the nitrogen atom as a part of a heterocyclic grouping, such as the quaternary ammonium salts of morpholine and the like.

Typical water-soluble quaternary ammonium salts and bases that can be used in the invention are tetramethyl ammonium chloride, tetramethyl ammonium hydroxide, dimethyl diethyl ammonium chloride, N,N dimethyl morpholinium sulfate and tetrabutyl ammonium bromide. Of these materials, tetramethyl ammonium chloride is preferred.

THE STARTING SILICA SOL

As indicated, a wide variety of aqueous colloidal silica sol may be used in the practice of the invention. Two such materials are sold under the designation NALCOAG 1050 and NALCOAG 1060. These silica sols and their properties are described below:

| Nalcoag 1050 | |
|---|---|
| Colloidal silica as $SiO_2$ | 50% |
| pH | 9.0 |
| Average Particle Size | 16-25 Mu |
| Average Surface Area | 120-176 $M^2$/gram |
| Specific Gravity (at 68° F.) | 1.390 |
| Viscosity | 70 cp (max.) |
| $Na_2O$ | 0.4% |
| Nalcoag 1060 | |
| Colloidal silica as $SiO_2$ | 50% |
| pH | 8.5 |
| Average Particle Size | 50-70 Mu |
| Average Surface Area | 40-60 $M^2$/gram |
| Specific Gravity (at 68° F.) | 1.390 |
| Viscosity at 77° F. | 15 cp (max) |

In addition to those sols described above, other silica sols, as well as their method is manufactured and set forth and described in U.S. Pat. No. 3,901,992, which is incorporated herein by reference.

To illustrate the advantage of the invention, a polishing test was conducted and set forth as described in U.S. Pat. No. 4,169,337. The results of these tests are set forth below in Table I.

TABLE I

| % $SiO_2$ in Slurry | % AEEA in Slurry | % TMA-Cl[1] in Slurry | Polishing Temp. | Polishing pH | Caustic for pH Adjust. | Percent Improvement |
|---|---|---|---|---|---|---|
| 3.27% | 0.131% AEEA[2] | None | 55° C. | 11.0 | NaOH | Control |
| 3.27% | None | 0.065% | | | Product Gelled | |
| 3.27% | 0.082% AEEA | 0.082% | 55° C. | 11.0 | NaOH | +2.9 |
| 3.27% | 0.131% AEEA | 0.114% | 55° C. | 11.0 | NaOH | +4.3 |
| 3.27% | 0.082% AEEA | 0.131% | 55° C. | 11.0 | NaOH | +6.5 |
| 3.27% | 0.131% TETA[3] | None | 55° C. | 11.0 | NaOH | +3.2% |
| 3.27% | 0.131% TETA | 0.032% | 55° C. | 11.0 | NaOH | +6.0% |
| 3.27% | 0.131% TETA | 0.065% | 55° C. | 11.0 | NaOH | +8.4% |
| 3.27% | 0.082% TETA | 0.114% | 55° C. | 11.0 | NaOH | +10.8% |

[1] TMA-Cl = Tetramethylammonium chloride
[2] AEEA = Aminoethylethanolamine
[3] TETA = Triethylenetetramine

Having thus described my invention, it is claimed as follows:

1. An improved method for polishing silicon wafers and like materials which comprises applying a polishing agent comprising:

1. An aqueous colloidal silica sol or gel having an average particle size diameter in the range 4–100 millimicrons,
2. A water-soluble amine which contains at least 1 primary amino group and from 2–8 carbon atoms and,
3. A water-soluble quaternary ammonium salt or base containing not more than 6 carbon atoms, and wherein both the amine and the quarternary ammonium salt or base is present at from 0.1–5.0% by weight based on the $SiO_2$ content of the silica sol; and then, polishing said wafers.

* * * * *